United States Patent
Namioka

(10) Patent No.: US 10,916,459 B2
(45) Date of Patent: Feb. 9, 2021

(54) PROTECTIVE MEMBER FORMING APPARATUS

(71) Applicant: DISCO CORPORATION, Tokyo (JP)

(72) Inventor: Shinichi Namioka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/527,692

(22) Filed: Jul. 31, 2019

(65) Prior Publication Data

US 2020/0043754 A1 Feb. 6, 2020

(30) Foreign Application Priority Data

Aug. 6, 2018 (JP) .................................. 2018-147525

(51) Int. Cl.
| | |
|---|---|
| H01L 21/00 | (2006.01) |
| H01L 21/67 | (2006.01) |
| B05C 1/02 | (2006.01) |
| H01L 21/304 | (2006.01) |
| H01L 21/02 | (2006.01) |
| H01L 21/683 | (2006.01) |

(52) U.S. Cl.
CPC ............ *H01L 21/6715* (2013.01); *B05C 1/02* (2013.01); *H01L 21/02282* (2013.01); *H01L 21/02307* (2013.01); *H01L 21/02623* (2013.01); *H01L 21/304* (2013.01); *H01L 21/67132* (2013.01); *H01L 21/6836* (2013.01)

(58) Field of Classification Search
CPC .................. H01L 21/304; H01L 21/02282
See application file for complete search history.

(56) References Cited

U.S. PATENT DOCUMENTS

| | | | |
|---|---|---|---|
| 2009/0008800 A1* | 1/2009 | Nakatani | H01L 21/563 257/778 |
| 2009/0203170 A1* | 8/2009 | Nakatani | H01L 21/563 438/108 |
| 2011/0151176 A1* | 6/2011 | Akiyama | H01L 21/6835 428/78 |
| 2020/0135531 A1* | 4/2020 | Sekiya | H01L 21/561 |
| 2020/0144120 A1* | 5/2020 | Suzuki | H01L 21/3043 |

FOREIGN PATENT DOCUMENTS

| | | |
|---|---|---|
| JP | 2017168565 A | 9/2017 |
| JP | 2017174883 A | 9/2017 |

* cited by examiner

*Primary Examiner* — Caridad Everhart
*Assistant Examiner* — Ankush K Singal
(74) *Attorney, Agent, or Firm* — Greer Burns & Crain Ltd.

(57) ABSTRACT

A holding table for holding a wafer includes plural pins, and a wafer holding surface includes the tips of the plural pins. Therefore, small dust enters between the pins and thus is less readily left between the wafer holding surface and the wafer. Therefore, when the wafer is sucked and held, a gap is less readily made between the wafer holding surface and the wafer. Thus, the occurrence of the situation in which the wafer is held in a waving state is suppressed. For this reason, when a liquid resin is pushed to spread over the lower surface of the wafer, an air bubble enters less readily between the liquid resin and the wafer. This can suppress entry of the air bubble in a protective member obtained by curing the liquid resin.

4 Claims, 4 Drawing Sheets

PROTECTIVE MEMBER FORMING APPARATUS

BACKGROUND OF THE INVENTION

Field of the Invention

The present invention relates to a protective member forming apparatus.

Description of the Related Art

The as-sliced wafer obtained by slicing a semiconductor ingot has undulation. A wafer is generated by removing the undulation and planarizing the as-sliced wafer. Regarding this, it is desired to remove the undulation by grinding one surface of the as-sliced wafer in the state in which the undulation has not been corrected. Thus, a protective member is formed on the other surface of the as-sliced wafer in the state in which the undulation has not been corrected, and the as-sliced wafer is held by a holding table with the intermediary of the protective member. Then, the one surface of the held as-sliced wafer is ground by a grinding abrasive. A protective member forming apparatus that forms the above-described protective member is disclosed in Japanese Patent Laid-open No. 2017-168565 and Japanese Patent Laid-open No. 2017-174883, for example.

SUMMARY OF THE INVENTION

In the conventional protective member forming apparatus, an as-sliced wafer is held by a holding surface of the lower surface of a holding table. Meanwhile, a film is placed on a stage opposed to the holding surface, and a liquid resin is supplied onto the film. Then, the other surface of the as-sliced wafer held by the holding surface is pressed against the liquid resin. Thereby, the liquid resin is pushed to spread across the whole of the other surface of the as-sliced wafer. The liquid resin pushed to spread is cured by curing means. Thereby, the protective member is formed.

It is conceivable that the other surface of the as-sliced wafer is pressed against the liquid resin with a strong force, for example, to complete the step of pushing and spreading the liquid resin in a short time. In this case, it is preferable that the holding surface of the holding table that holds the one surface of the as-sliced wafer be flat in order to avoid breaking of the as-sliced wafer due to a reaction force attributed to application of the strong force to the liquid resin. For this reason, the holding surface is formed of a porous member.

However, after the protective member is formed, when the as-sliced wafer on which the protective member has been formed is carried out, the resin is separated from the peripheral edge of the as-sliced wafer, and a small piece of the separated resin adheres to the holding surface in some cases. When the next as-sliced wafer is sucked and held by the holding surface to which the small piece of the resin remains adhering, a gap is made between the holding surface and the as-sliced wafer. Thus, the as-sliced wafer is held in a waving state. When the liquid resin is pushed to spread by the as-sliced wafer in the waving state, an air bubble enters between the liquid resin pushed to spread and the as-sliced wafer.

When the liquid resin is cured with the air bubble remaining therebetween, the air bubble enters the protective member. When the as-sliced wafer is ground in this state, the part corresponding to the air bubble of the protective member in the as-sliced wafer becomes thinner than the other part. For this reason, it becomes difficult to generate a wafer with uniform thickness.

Thus, an object of the present invention is to provide a protective member forming apparatus that can suppress entry of an air bubble into a protective member.

In accordance with an aspect of the present invention, there is provided a protective member forming apparatus including a holding table having a workpiece holding surface that sucks and holds an upper surface of a workpiece, a stage that is disposed opposed to the workpiece holding surface and holds a lower surface of a film, resin supply means that supplies a liquid resin onto an upper surface of the film held by the stage, expanding means that pushes and spreads the liquid resin on the upper surface of the film by a lower surface of the workpiece held by the workpiece holding surface by causing the holding table to move in such a direction as to come closer to the stage, and curing means that cures the liquid resin pushed to spread and forms a protective member. The holding table includes a base with a flat plate shape, a plurality of pins disposed upright in a downward direction on a lower surface of the base, an annular wall that surrounds the plurality of pins and has a lower surface with the same height as tips of the pins, and a suction path that penetrates the base and communicates with a suction source inside the annular wall.

Preferably, the workpiece includes a ring frame, an adhesive tape that closes an opening of the ring frame and is stuck to the ring frame, and a wafer stuck to a part inside the opening in the adhesive tape. In this case, the protective member is formed by sucking and holding an upper surface of the wafer stuck to the adhesive tape by the workpiece holding surface and pushing and spreading the liquid resin on the film by a lower surface of the adhesive tape stuck to a lower surface of the wafer.

In this case, the adhesive tape includes a ring-shaped adhesive stuck to the ring frame, and a tape base that does not have the adhesive in the adhesive tape is brought into tight contact with the wafer.

According to the present invention, the workpiece holding surface for sucking and holding the workpiece in the holding table includes the tips of the plural pins. Therefore, even when small dust such as a small piece of the resin adheres to the workpiece holding surface or the workpiece, the dust enters between the pins in the workpiece holding surface when the workpiece holding surface sucks and holds the workpiece. Thus, the small dust is less readily left between the workpiece holding surface and the workpiece.

Therefore, when the workpiece is sucked and held by the workpiece holding surface, a gap is less readily made between the workpiece holding surface and the workpiece. Thus, the occurrence of the situation in which the workpiece is held in a waving state is suppressed. For this reason, when the liquid resin is pushed to spread over the lower surface of the workpiece, an air bubble enters less readily between the liquid resin and the workpiece. This can suppress entry of the air bubble in the protective member obtained by curing the liquid resin. As a result, in later grinding processing, grinding finishing of the workpiece can be executed in such a manner that the workpiece has a uniform thickness.

Preferably, the workpiece is composed of the ring frame, the adhesive tape that closes the opening of the ring frame and is stuck to the ring frame, and the wafer stuck to the part inside the opening in the adhesive tape. Using such ring frame and adhesive tape is effective when bumps are formed on the lower surface of the wafer, for example.

In this case, the workpiece holding surface sucks and holds the upper surface of the wafer. Then, the liquid resin is pushed to spread over the lower surface of the adhesive tape stuck to the lower surface of the wafer. Thereafter, the ring frame is removed. This can obtain the wafer that has the adhesive tape on the lower surface on which the bumps are formed and further has the protective member on the adhesive tape. In grinding processing for the wafer, the lower surface of the wafer is held with the intermediary of the protective member and the adhesive tape. In this state, the upper surface of the wafer is ground by a grinding abrasive. After the grinding processing, the protective member and the adhesive tape are separated in that order from the wafer.

In this configuration, recesses and projections according to the bumps of the wafer are formed in the adhesive tape. However, the protective member absorbs the recesses and projections, and therefore the surface held in the grinding processing can be planarized. Furthermore, the direct contact of the protective member with the bumps on the lower surface of the wafer can be avoided. This can suppress the occurrence of the situation in which the resin of the protective member clings to the bumps of the wafer and it becomes difficult to remove the protective member from the wafer.

Furthermore, the tape base that does not have the adhesive is used as the part brought into tight contact with the wafer in the adhesive tape. This makes it easy to separate the adhesive tape from the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
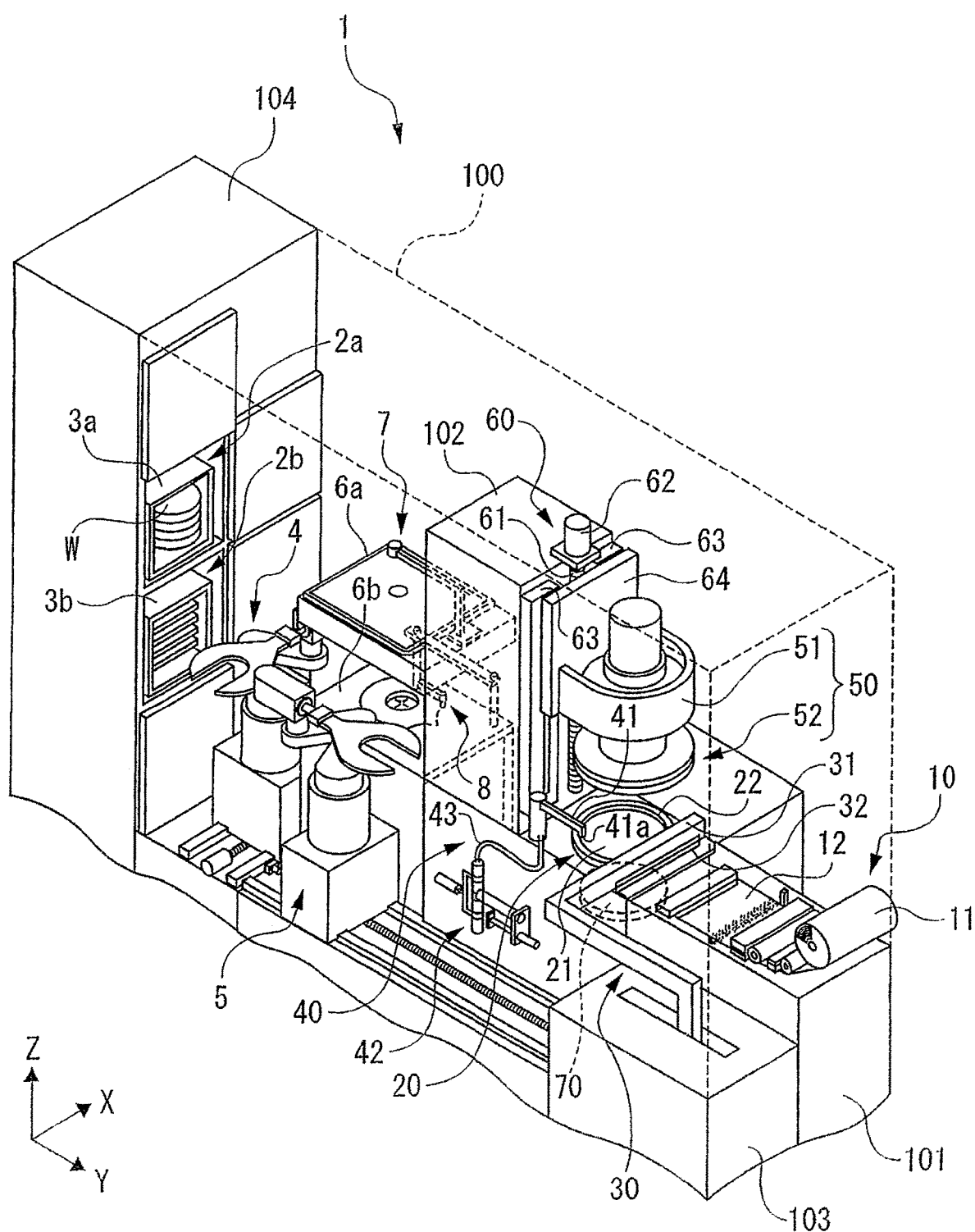
FIG. 1 is a perspective view depicting the configuration of a protective member forming apparatus.

A protective member forming apparatus 1 depicted in FIG. 1 is one example of an apparatus that forms a protective member by pushing and spreading a liquid resin over the lower surface of a wafer W and curing the liquid resin. The wafer W is one example of a workpiece and is a silicon wafer with a plate shape, for example.

The protective member forming apparatus 1 includes a casing 100, an apparatus base 101 disposed in the casing 100, a column 102 disposed upright on the apparatus base 101, a support base 103 disposed adjacent to the apparatus base 101, and a cassette housing main body 104 joined to the rear end side of the casing 100.

The cassette housing main body 104 has housing spaces 2a and 2b at two stages in the upward-downward direction. A cassette 3a in which plural wafers W before the protective member is formed are housed is disposed in the housing space 2a at the upper stage. A cassette 3b in which plural wafers W on which the protective member has been formed are housed is disposed in the housing space 2b at the lower stage.

A first support pedestal 6a and a second support pedestal 6b located on the lower side of the first support pedestal 6a are joined to the rear side of the column 102 in the Y-axis direction. A wafer detecting part 7 is disposed on the first support pedestal 6a. The wafer detecting part 7 detects the center position and orientation of the wafer W before the protective member is formed. A film cutter 8 is disposed on the second support pedestal 6b. The film cutter 8 cuts the protective member formed on the wafer W along the outer shape of the wafer W.

A first wafer conveying mechanism 4 is disposed between the cassette housing main body 104 and the wafer detecting part 7 and the film cutter 8. The first wafer conveying mechanism 4 carries out and in the wafer W from and to the cassettes 3a and 3b. The first wafer conveying mechanism 4 can carry out the wafer W before the protective member is formed from the cassette 3a and carry in the wafer W to the first support pedestal 6a. Moreover, the first wafer conveying mechanism 4 can carry out the wafer W on which the protective member has been formed from the second support pedestal 6b and carry in the wafer W to the cassette 3b.

The apparatus base 101 is equipped with film supply means 10 having a roll part 11 and a stage 20 that holds the lower surface of a film 12. The roll part 11 is formed through winding of the film 12 into a roll shape.

The stage 20 includes a circular film holding surface 21 that holds the film 12 and a ring-shaped projection part 22 formed at the periphery of the film holding surface 21. A resin is dropped onto the upper surface of the film 12 held by the film holding surface 21. The stage 20 is configured to accumulate the liquid resin in a region inside the projection part 22 and suppress scattering of the liquid resin to the outside of the projection part 22. The film holding surface 21 is formed of quartz glass, for example. In the film holding surface 21, plural suction holes connected to a suction source are formed (neither is depicted). The film holding surface 21 is configured to suck and hold the film 12 placed on the film holding surface 21 from the lower side.

Film placement means 30 is disposed on the support base 103. The film placement means 30 includes an arm part 31 that extends along a direction (X-axis direction) intersecting the Y-axis direction and a clamp part 32 attached to a side surface of the arm part 31. Furthermore, the clamp part 32 can clamp the film 12 rolled into the roll part 11 and pull the film 12 in the Y-axis direction to place the film 12 on the stage 20.

Resin supply means 40 that drops a predetermined amount of liquid resin onto the film 12 held by the stage 20 is disposed near the stage 20. The resin supply means 40 includes a resin supply nozzle 41, a dispenser 42 that sends out the liquid resin to the resin supply nozzle 41, and a connecting tube 43 that connects the resin supply nozzle 41 and dispenser 42. The resin supply nozzle 41 has a supply port 41a that supplies the liquid resin toward the film holding surface 21 of the stage 20. The dispenser 42 is connected to a resin supply source that is not depicted. The resin supply nozzle 41 can pivot and allows the supply port 41a to be positioned to the upper side of the stage 20.

Figure 2:
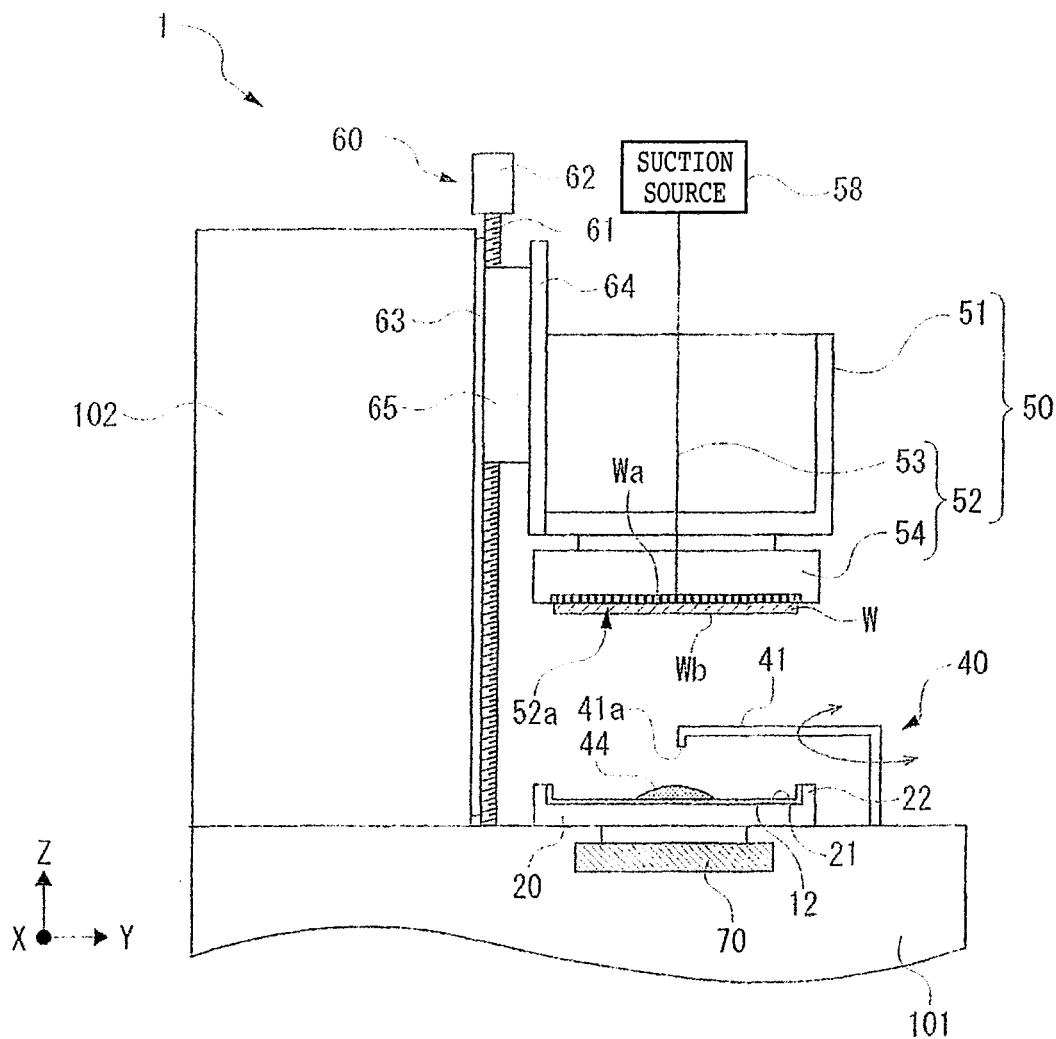
FIG. 2 is a partial sectional side view of the protective member forming apparatus.

On the front side of the column 102 in the Y-axis direction, as depicted in FIG. 2, holding means 50 that holds the wafer W and expanding means 60 that moves the holding means 50 are disposed. The holding means 50 has a support structure 51 attached to the expanding means 60 and a holding table 52 attached to the support structure 51. The support structure 51 is fixed to the expanding means 60 in the state of supporting the holding table 52 and moves in a Z-axis direction in conjunction with the expanding means 60.

The holding table 52 has a wafer holding surface 52a that sucks and holds the upper surface of the wafer W. The above-described stage 20 is disposed opposed to the wafer holding surface 52a of the holding table 52. The wafer holding surface 52a is equivalent to one example of the workpiece holding surface.

Figure 3:
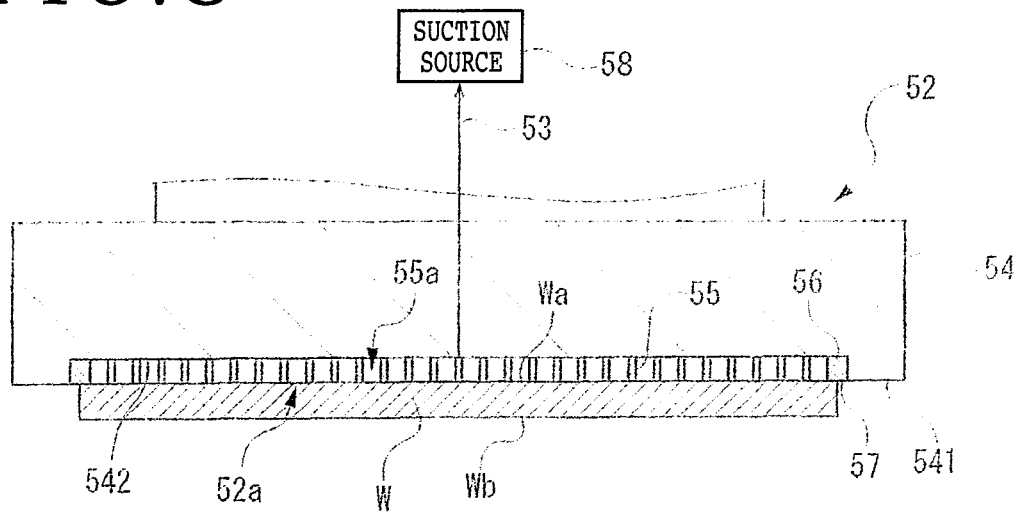
FIG. 3 is a sectional view depicting the configuration of a holding table.

As depicted in FIG. 2 and FIG. 3, the holding table 52 includes a base 54 with a flat plate shape, plural pins 55 and a suction path 53 disposed for the base 54, and an annular wall 56 that surrounds the plural pins 55. The base 54 is formed in such a manner that an annular peripheral projection part 541 protrudes downward at the peripheral part of the base 54. A suction recess part 542 is formed inside the peripheral projection part 541.

The plural pins 55 are disposed upright on the surface (bottom surface) of the suction recess part 542, which is the lower surface of the base 54, in the state of drooping downward. The annular wall 56 is disposed on the peripheral side of the suction recess part 542. The annular wall 56 surrounds the plural pins 55 and has a lower surface 57. The lower surface 57 has substantially the same height as the tips of the plural pins 55. The suction path 53 penetrates the base 54 and causes the inside of the annular wall 56 to communicate with a suction source 58.

Gaps 55a between the respective adjacent pins 55 are set at an almost equal interval. Furthermore, the plural pins 55 are configured to have substantially the same height. Due to this, the wafer holding surface 52a of the holding table 52 for holding the wafer W is formed by the tips of the plural pins 55. The number of pins 55 and the material thereof are not particularly limited.

In the holding table 52, the suction source 58 causes a negative pressure to act on the suction recess part 542 through the suction path 53. This can suck and hold the wafer W by the wafer holding surface 52a formed by the tips of the plural pins 55.

The expanding means 60 depicted in FIG. 1 and FIG. 2 moves the holding means 50 including the holding table 52 in the Z-axis direction. Specifically, the expanding means 60 causes the holding table 52 to move in such a direction as to come closer to the stage 20 to thereby push and spread the liquid resin on the upper surface of the film 12 by a lower surface Wb of the wafer W held by the wafer holding surface 52a.

The expanding means 60 includes a ball screw 61 that extends along the Z-axis direction, a motor 62 connected to one end of the ball screw 61, a pair of guide rails 63 that extend in parallel to the ball screw 61, and a raising-lowering plate 64 with one surface to which the holding means 50 is joined. The other surface of the raising-lowering plate 64 is in slide contact with the pair of guide rails 63. A nut part 65 is formed on the other surface side of the raising-lowering plate 64. The ball screw 61 is screwed to the nut part 65.

In the expanding means 60, the ball screw 61 rotates by the motor 62 and thereby the raising-lowering plate 64 moves in the Z-axis direction along the pair of guide rails 63. This allows the expanding means 60 to raise and lower the holding means 50 in a direction substantially perpendicular to the film holding surface 21 of the stage 20.

Curing means 70 is disposed in the apparatus base 101. The curing means 70 cures the liquid resin pushed to spread over the lower surface Wb of the wafer W by the expanding means 60. Thereby, the curing means 70 forms the protective member on the lower surface Wb of the wafer W. The curing means 70 has a ultraviolet (UV) lamp that irradiates the liquid resin with ultraviolet rays, for example.

A second wafer conveying mechanism 5 is disposed between the holding means 50 and the cassette housing main body 104. The second wafer conveying mechanism 5 can carry out the wafer W from the first support pedestal 6a and pass the wafer W to the holding table 52 of the holding means 50. Furthermore, the second wafer conveying mechanism 5 can retrieve the wafer W on which the protective member has been formed from the holding means 50 and carry in the wafer W to the second support pedestal 6b.

Next, a first operation example of the protective member forming apparatus 1 will be described. First, the first wafer conveying mechanism 4 takes out one wafer W before the protective member is formed from the cassette 3a and conveys the wafer W to the first support pedestal 6a. The wafer detecting part 7 detects the center position and orientation of the wafer W. Thereafter, the second wafer conveying mechanism 5 carries out the wafer W from the first support pedestal 6a and passes the wafer W to the holding means 50.

In the holding means 50, the wafer holding surface 52a of the holding table 52 sucks and holds an upper surface Wa of the wafer W as depicted in FIG. 2. Specifically, when the wafer W gets contact with the wafer holding surface 52a depicted in FIG. 3 and the plural pins 55 are covered by the upper surface Wa of the wafer W, the gaps 55a between the respective pins 55 covered are hermetically sealed. Subsequently, the pressure in the gaps 55a between the hermetically-sealed pins 55 is set to a negative pressure by a suction force of the suction source 58, and thereby the wafer holding surface 52a sucks and holds the upper surface Wa of the wafer W. At this time, the periphery of the wafer W is in contact with the lower surface 57 of the annular wall 56, and therefore the occurrence of a vacuum leak is suppressed. In this manner, the wafer holding surface 52a can stably suck and hold the upper surface Wa of the wafer W.

Concurrently with the conveyance of the wafer W to the holding means 50, the clamp part 32 of the film placement means 30 depicted in FIG. 1 draws the film 12 from the roll part 11 by clamping the film 12 and moving in the Y-axis direction. The clamp part 32 places the drawn film 12 on the film holding surface 21 of the stage 20. Then, the film 12 receives action by a suction source that is not depicted and is sucked and held by the film holding surface 21.

As depicted in FIG. 2, the resin supply means 40 positions the supply port 41a of the resin supply nozzle 41 to the upper side of the stage 20 by causing the resin supply nozzle 41 to pivot. Subsequently, the dispenser 42 depicted in FIG. 1 sends out a liquid resin 44 whose temperature is managed to a predetermined temperature (for example, 19° C.) to the resin supply nozzle 41. Thereby, the liquid resin 44 is dropped from the supply port 41a of the resin supply nozzle 41 toward the film 12 sucked and held by the stage 20. As the liquid resin 44, an ultraviolet-curable resin is used, for example. Then, when a predetermined amount of liquid resin 44 is deposited on the film 12, the resin supply means 40 stops the supply of the liquid resin 44 to the film 12.

Figure 4:
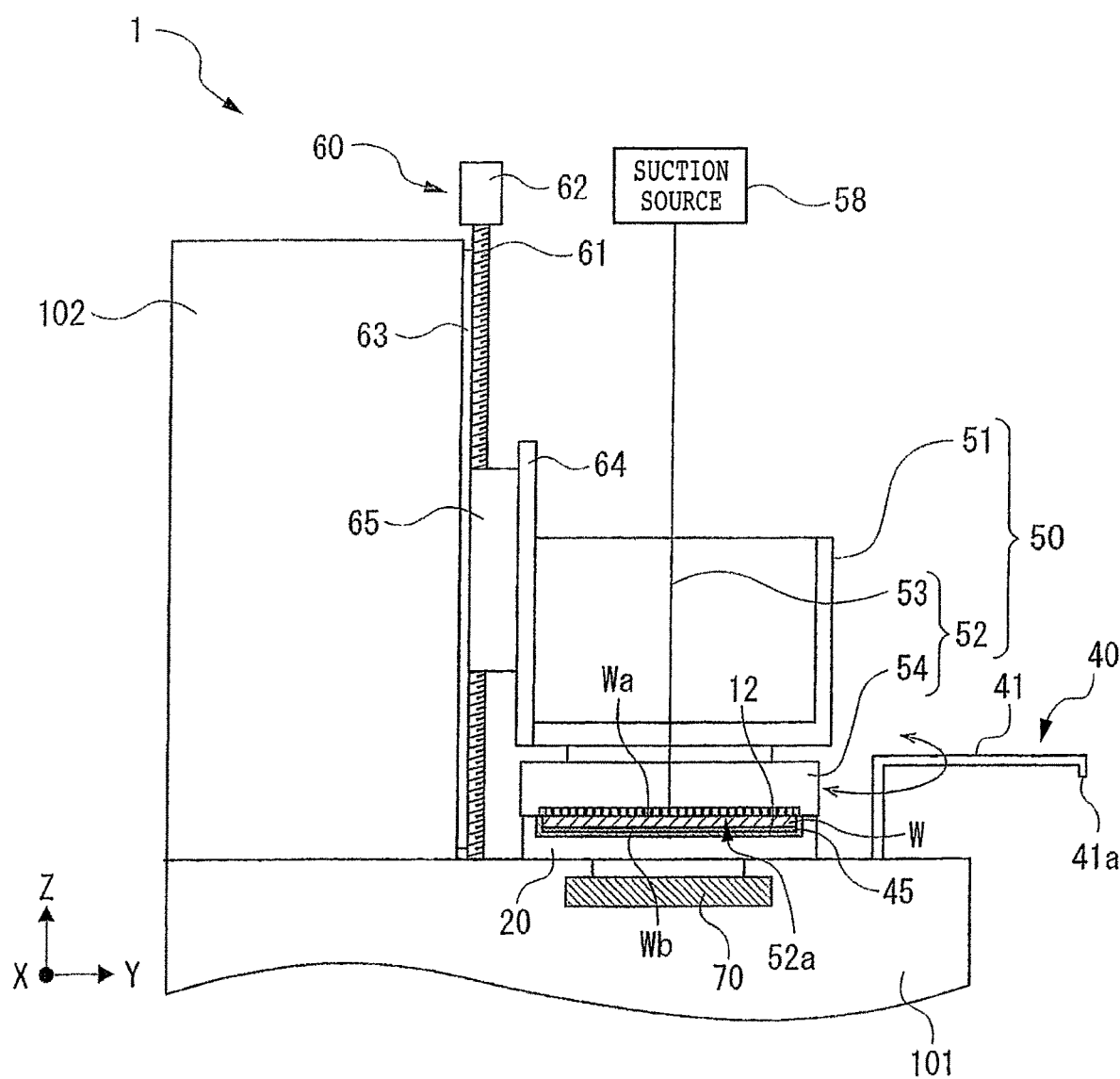
FIG. 4 is a partial sectional side view of the protective member forming apparatus.

Subsequently, the expanding means 60 rotates the ball screw 61 by the motor 62 and lowers the holding means 50. As described above, at this stage, the wafer holding surface 52a of the holding table 52 in the holding means 50 sucks and holds the upper surface Wa of the wafer W. Therefore, in association with the lowering of the holding means 50, the lower surface Wb of the wafer W sucked and held gets contact with the liquid resin 44 as depicted in FIG. 4. When the holding means 50 further lowers, the liquid resin 44 is pressed downward by the lower surface Wb of the wafer W and is pushed to spread in the radial direction of the wafer W to have a predetermined thickness.

Thereafter, the curing means 70 irradiates the liquid resin 44 expanded to have the predetermined thickness with ultraviolet light through the stage 20 made of glass. As a result, the liquid resin 44 is cured, and a protective member 45 that is composed of the liquid resin 44 and has a predetermined thickness is formed on the lower surface Wb of the wafer W.

The wafer W on which the protective member 45 has been formed is conveyed to the second support pedestal 6b by the second wafer conveying mechanism 5. The excess film 12 is cut along the outer shape of the wafer W by the film cutter 8, and thereafter the wafer W is housed in the cassette 3b by the first wafer conveying mechanism 4.

Thereafter, grinding processing for correcting undulation is executed for the wafer W on which the protective member 45 has been formed. In the grinding processing, the upper surface Wa of the wafer W is ground by a grinding abrasive in the state in which the lower surface Wb of the wafer W is held by a holding table (not depicted) with the intermediary of the protective member 45. After the grinding processing, the protective member 45 is separated from the wafer W.

As described above, in the protective member forming apparatus 1, the holding table 52 for holding the wafer W has the plural pins 55 disposed upright in the downward direction. Furthermore, the wafer holding surface 52a for sucking and holding the wafer W in the holding table 52 includes the tips of the plural pins 55. Therefore, even when small dust such as a small piece of the resin adheres to the wafer holding surface 52a or the wafer W, the dust enters between the plural pins 55 in the wafer holding surface 52a when the wafer holding surface 52a sucks and holds the wafer W. Thus, the small dust is less readily left between the wafer holding surface 52a and the wafer W.

Therefore, when the wafer W is sucked and held by the wafer holding surface 52a, a gap is less readily made between the wafer holding surface 52a and the wafer W. Thus, the occurrence of the situation in which the wafer W is held in a waving state is suppressed. For this reason, when the liquid resin 44 is pushed to spread over the lower surface Wb of the wafer W, an air bubble enters less readily between the liquid resin 44 and the wafer W. This can suppress entry of the air bubble in the protective member 45 obtained by curing the liquid resin 44. As a result, in the later grinding processing, grinding finishing of the wafer W can be executed in such a manner that the wafer W has a uniform thickness.

The workpiece that can be handled in the protective member forming apparatus 1 is not limited to the wafer W with a plate shape. The workpiece may be a wafer unit W1 like one depicted in FIG. 5, for example. The wafer unit W1 includes the wafer W having bumps B on the lower surface Wb, an adhesive tape S that covers the whole of the lower surface Wb of the wafer W, and a ring frame F that is formed around the wafer W and has an annular shape.

The ring frame F is a component that houses the wafer W and has an opening F1. The adhesive tape S has an adhesive G at a part that gets contact with the ring frame F. The adhesive tape S is stuck to the ring frame F with the intermediary of the adhesive G in such a manner as to close the opening F1 of the ring frame F.

Figure 5:
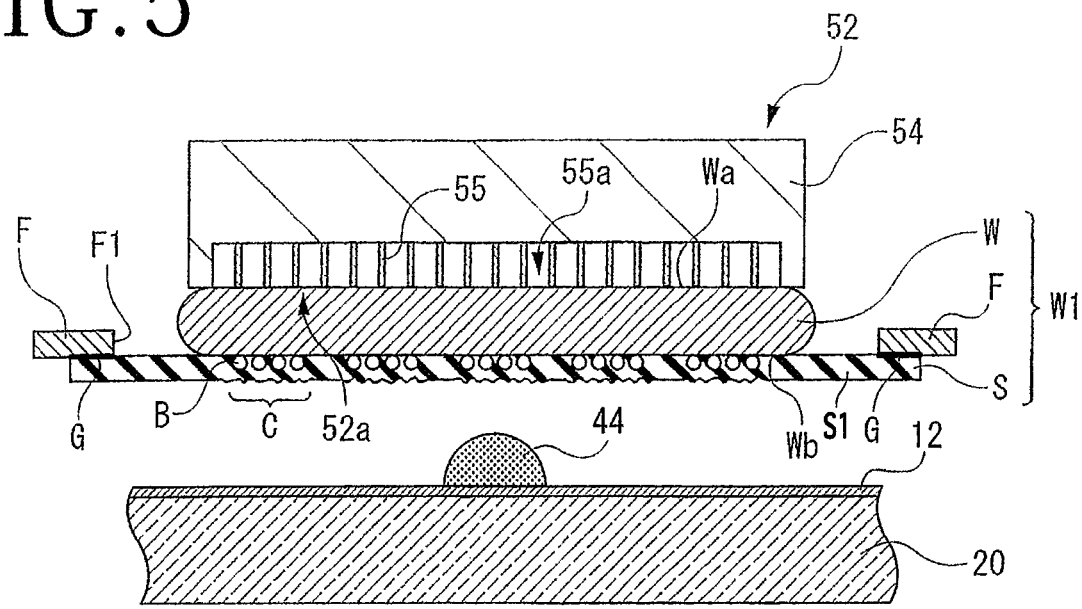
FIG. 5 is a sectional view depicting an example in which a protective member is formed on a wafer unit.

Furthermore, the lower surface Wb of the wafer W is stuck to a part inside the opening F1 of the ring frame F in the adhesive tape S. Here, the part that gets contact with the wafer W in the adhesive tape S is a tape base S1 that does not have the adhesive G. However, through biting of the bumps B of the wafer W into the adhesive tape S, sticking of the lower surface Wb of the wafer W to the adhesive tape S is enabled. As depicted in FIG. 5, recesses and projections C according to the shape of the bumps B are formed at the part corresponding to the bumps B in the adhesive tape S.

The tape base S1 of the adhesive tape S has a thickness of 30 to 100 μm and the material thereof is polyolefin. Furthermore, because the tape base S1 does not have the adhesive G, the adhesive tape S is pressed against the wafer W by a roller, or air is sprayed from an air nozzle toward the adhesive tape S to cause the adhesive tape S to be stuck to (get tight contact with) the lower surface Wb of the wafer W.

In forming of the protective member 45 onto the wafer unit W1 having such a configuration, the wafer holding surface 52a of the holding table 52 sucks and holds the wafer W of the wafer unit W1 similarly to the case of the above-described wafer W. Furthermore, a predetermined amount of liquid resin 44 is supplied onto the film 12 of the stage 20 (see FIG. 2).

Figure 6:
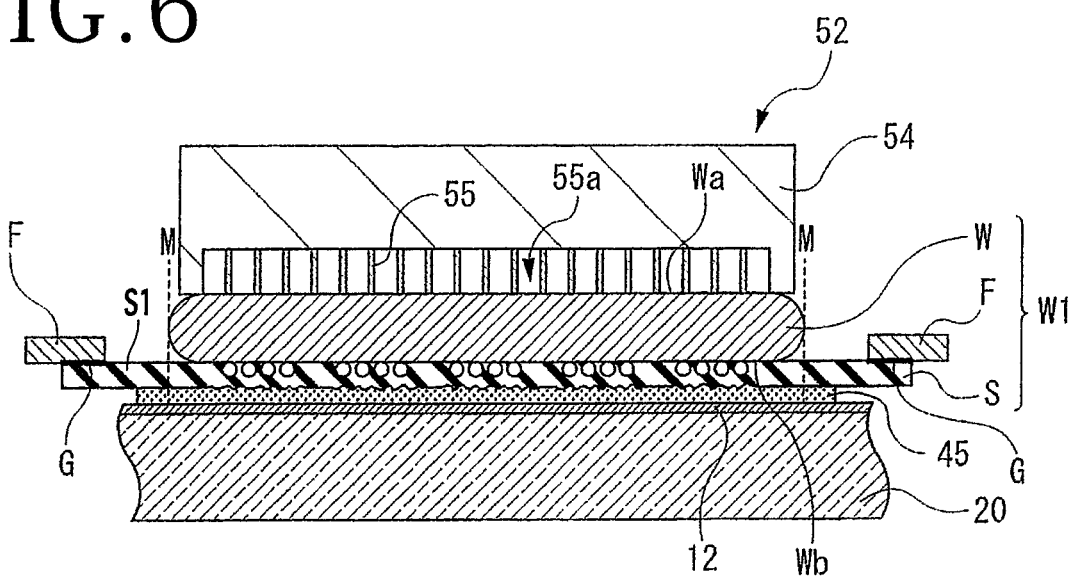
FIG. 6 is a sectional view depicting the example in which the protective member is formed on the wafer unit.

Next, the holding table 52 is lowered by the expanding means 60 depicted in FIG. 4 and so forth. In association with this, the adhesive tape S stuck to the lower surface Wb of the wafer W gets contact with the liquid resin 44 as depicted in FIG. 6. When the holding table 52 further lowers, the liquid resin 44 is pressed downward by the lower surface of the adhesive tape S and is pushed to spread in the radial direction of the wafer W to have a predetermined thickness. Thereafter, the liquid resin 44 is cured by the curing means 70 depicted in FIG. 4 and so forth, and the protective member 45 with a predetermined thickness is formed on the adhesive tape S.

Figure 7:
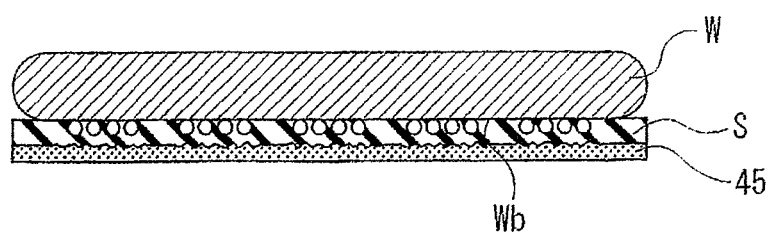
FIG. 7 is a sectional view depicting a wafer over which the protective member is formed.

Thereafter, the adhesive tape S is cut at positions indicated by dotted lines M in FIG. 6. Thereby, as depicted in FIG. 7, the wafer W that has the adhesive tape S on the lower surface Wb on which the bumps B are formed and further has the protective member 45 on the adhesive tape S can be obtained.

Thereafter, grinding processing for correcting undulation is executed for the wafer W on which the protective member 45 has been formed. In the grinding processing, the upper surface Wa of the wafer W is ground by a grinding abrasive in the state in which the lower surface Wb of the wafer W is held by a holding table (not depicted) with the intermediary of the protective member 45 and the adhesive tape S. After the grinding processing, the protective member 45 and the adhesive tape S are separated from the wafer W.

In this configuration, the protective member 45 is formed over the lower surface Wb of the wafer W having the bumps B with the intermediary of the adhesive tape S, and the protective member 45 and the adhesive tape S are separated in that order from the wafer W after the grinding processing. Therefore, the protective member 45 absorbs the recesses and projections C according to the bumps B in the adhesive tape S, and therefore the surface held by the holding table in the wafer W can be planarized. Furthermore, the direct contact of the protective member 45 (liquid resin 44) with the bumps B on the lower surface Wb of the wafer W can be avoided. This can suppress the occurrence of the situation in which the resin of the protective member 45 clings to the bumps B and it becomes difficult to remove the protective member 45 from the wafer W.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member forming apparatus comprising:
a holding table having a workpiece holding surface that sucks and holds an upper surface of a workpiece;
a stage that is disposed opposed to the workpiece holding surface and holds a lower surface of a film;
resin supply means that supplies a liquid resin onto an upper surface of the film held by the stage;
expanding means that pushes and spreads the liquid resin on the upper surface of the film by a lower surface of the workpiece held by the workpiece holding surface by causing the holding table to move in such a direction as to come closer to the stage; and
curing means that cures the liquid resin pushed to spread and forms a protective member, wherein
the holding table includes
a base with a flat plate shape,
an annular wall on a peripheral edge of the base, the annular wall defines a suction recess part;
a plurality of pins disposed upright in the suction recess part and extending in a downward direction from a lower surface of the base and gaps formed between the plurality of pins, wherein the annular wall surrounds the plurality of pins and has a lower surface with the same height as tips of the pins, and
a suction path that penetrates the base and communicates with a suction source inside the annular wall,
wherein when the wafer comes into contact with the wafer holding surface and the plurality of pins are covered by the upper surface of the workpiece, the gaps between the plurality of pins are hermetically sealed and set to a negative pressure by a suction force of the suction source to thereby hold the wafer by the suction force of the wafer holding surface.

2. A protective member forming apparatus comprising:
a holding table having a holding surface that sucks and holds an upper surface of a wafer;
a stage that is disposed opposed to the holding surface and holds a lower surface of a film;
resin supply means that supplies a liquid resin onto an upper surface of the film held by the stage;
expanding means that pushes and spreads the liquid resin on the upper surface of the film by a lower surface of the wafer held by the holding surface by causing the holding table to move in such a direction as to come closer to the stage; and
curing means that cures the liquid resin pushed to spread and forms a protective member,
a ring frame,
an adhesive tape that closes an opening of the ring frame and has a peripheral part stuck to the ring frame, wherein the wafer is stuck to a part inside the opening in the adhesive tape, and
the protective member is formed by sucking and holding an upper surface of the wafer stuck to the adhesive tape by the workpiece holding surface and pushing and spreading the liquid resin on the film by a lower surface of the adhesive tape stuck to a lower surface of the wafer,
wherein the holding table includes:
a base with a flat plate shape,
a plurality of pins disposed upright in a downward direction on a lower surface of the base,
an annular wall that surrounds the plurality of pins and has a lower surface with the same height as tips of the pins, and
a suction path that penetrates the base and communicates with a suction source inside the annular wall,
wherein when the wafer comes into contact with the wafer holding surface and the plurality of pins are covered by the upper surface of the wafer, gaps between the plurality of pins are hermetically sealed and set to a negative pressure by a suction force of the suction source to thereby hold the wafer by the suction force of the wafer holding surface.

3. The protective member forming apparatus according to claim 2, wherein the adhesive tape includes a tape base having a first surface and a second surface on an opposite side to the first surface and a ring-shaped adhesive disposed on the first surface of the tape base, and the first surface of the tape base on which the ring-shaped adhesive is not disposed is brought into tight contact with the wafer when the protective member is formed.

4. The protective member forming apparatus according to claim 2, wherein said annular wall forms a suction recess part, and said plurality of pins extend from a bottom surface of said suction recess part.

* * * * *